United States Patent [19]

Horng et al.

[11] 4,118,250

[45] Oct. 3, 1978

[54] PROCESS FOR PRODUCING INTEGRATED CIRCUIT DEVICES BY ION IMPLANTATION

[75] Inventors: Cheng Tzong Horng, Fishkill; Alwin Earl Michel, Ossining; Hans Stephan Rupprecht, Yorktown Heights; Robert Otto Schwenker, Hopewell Junction, all of N.Y.

[73] Assignee: International Business Machines Corporation, Armonk, N.Y.

[21] Appl. No.: 865,805

[22] Filed: Dec. 30, 1977

[51] Int. Cl.$^2$ ............... H01L 21/265; H01L 21/223
[52] U.S. Cl. .............................. 148/1.5; 148/187; 357/34; 357/50; 357/91
[58] Field of Search .................... 357/34, 50, 91; 148/187, 1.5

[56] References Cited

U.S. PATENT DOCUMENTS

| | | | |
|---|---|---|---|
| 3,972,754 | 8/1976 | Riseman | 148/175 |
| 3,998,674 | 12/1976 | Cameron et al. | 148/175 |
| 4,002,511 | 1/1977 | Magdo et al. | 148/187 |
| 4,009,057 | 2/1977 | Bebisson et al. | 148/1.5 |
| 4,018,627 | 4/1977 | Polata | 148/1.5 |
| 4,021,270 | 5/1977 | Hunt et al. | 148/1.5 |
| 4,029,527 | 6/1977 | Glasl et al. | 148/187 |
| 4,063,967 | 12/1977 | Graul et al. | 148/1.5 |

Primary Examiner—L. Dewayne Rutledge
Assistant Examiner—Roy Upendra
Attorney, Agent, or Firm—Wolmar J. Stoffel

[57] ABSTRACT

In this process of producing a bipolar transistor, all the regions of the device except the emitter region are formed by ion implantation through an inorganic dielectric layer of uniform thickness. Subsequently, all the contact openings to the emitter, base and collector are formed and the emitter is implanted through the emitter contact opening. This unique combination of process steps permits the use of a surface insulating dielectric layer of uniform thickness, wherein all capacitances are uniform and controllable while still permitting direct implantation of the emitter, which, because of its shallow depth is difficult to implant through an oxide.

11 Claims, 12 Drawing Figures

PROCESS FOR PRODUCING INTEGRATED CIRCUIT DEVICES BY ION IMPLANTATION

BACKGROUND OF THE INVENTION

This invention relates to monolithic integrated circuit devices, their structure, and preparation, and more particularly to their fabrication using ion implantation techniques.

The progress in solid state technology is largely determined by the ability to control and modify material parameters in a well defined manner. Semiconductors are a typical example, where minute traces of impurities will markedly influence the electrical properties. The concept of introducing dopants into semiconductors by means of high energetic particles is well known. This introduction of particles is commonly referred to as ion implantation which is defined as a process in which a beam of energetic particles is directed against a body of materials to selectively affect electrical and/or chemical changes in the body by the causing of the ions, of the beam, to pass into the body of the treated material.

Ion implantation of impurities into semiconductor substrates has a number of significant advantages in the fabrication of semiconductor devices over the more conventional introduction by thermal diffusion. Since ion implantation is not a high temperature process, a larger number of materials, including organic photoresists, can be used as masking for controlling the area of implantation into the substrate. Also, multiple impurity introduction operations can be achieved without resort to high temperatures. Exposure to high temperatures, as in thermal diffusion, disperses the impurities previously introduced. Ion implantation techniques permit greater control of the placement and depth of penetration into the semiconductor. In general, the total amounts of impurities introduced and the depths of penetration can be more closely controlled by ion implantation techniques than with thermal diffusion.

Consequently, integrated circuit devices can be made smaller, with greater precision, with better control of heating, and with higher operating speeds using ion implantation technology. As the semiconductor devices become smaller, parasitic capacitances associated with metallurgy and passivation layers becomes more significant. While parasitic capacitances cannot be eliminated, it is important that they be made as uniform and predictable as possible in order that their effects can be accommodated in the best possible manner. A significant parasitic capacitance variation is associated with the metallurgy of a device and is particularly concerned with the thickness of the dielectric layer which separates the metallurgy from the semiconductor substrate and the active areas therein. In ordinary semiconductor processing, windows are formed for introducing impurities, both for ion implantation and thermal diffusion techniques. Following the introduction of the impurities into the semiconductor substrate, the surface of the substrate, normally silicon, is reoxidized. Since the silicon for this thermal oxidation operation is derived from the substrate, the interface between the oxide and the substrate is depressed. This effect combined with inherent differences in the oxide thicknesses, compared to the oxide left in place which is thicker than the re-oxidized areas produces significant surface dielectric layer thickness differences. In the parasitic capacitor, the metallurgy consists of one capacitor plate, the silicon substrate the other plate, and the passivating surface oxide layer acts as the dielectric. The thickness of the dielectric thus significantly influences the parasitic capacitance. When the thickness varies the parasitic capacitance becomes quite unpredictable.

SUMMARY OF THE INVENTION

It is therefore an object of this invention to provide an improved method for fabricating an integrated circuit semiconductor device using ion implantation technology wherein the dielectric layer over the active areas of the device has a uniform thickness thereby making the parasitic capacitance associated therewith more uniform and predictable, and facilitating the etching of the contact openings.

In order to achieve the aforementioned object there is presented an improved process for making an integrated circuit semiconductor device in a monocrystalline semiconductor substrate by forming a subcollector region of a first conductivity type in a monocrystalline semiconductor substrate of a second opposite conductivity type, depositing an epitaxial layer of semiconductor material on the substrate, oxidizing the surface above the epitaxial layer to form a layer of thermal $SiO_2$, forming an annular shaped isolation means that encompasses the region of the epitaxial layer overlying the subcollector region, ion implanting in an impurity of a second conductivity through the $SiO_2$ layer to form a base region, forming windows in the $SiO_2$ layer for the collector contact, the base contact, and the emitter contact, masking the base contact, ion implanting an impurity of the first conductivity to form the collector contact region and the emitter region through the openings in the $SiO_2$ layer, heating the resultant device to activate the implanted first and second type impurities and to drive in the impurity constituting the emitter region, and depositing the metallurgy system on the surface of the device.

DESCRIPTION OF THE PREFERRED EMBODIMENTS

Figure 1:
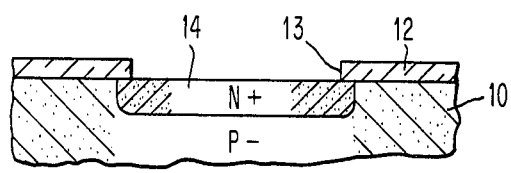
FIGS. 1 through 10 is a sequence of elevational views in broken section illustrating the internal device structure at various stages of the process of the invention.
Figure 2:
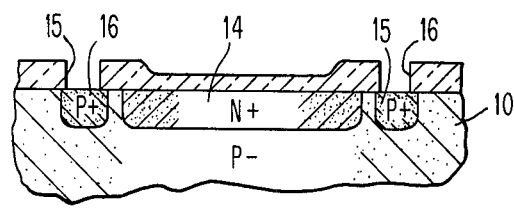
Figure 3:
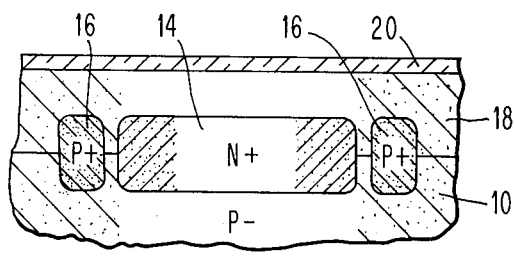
Figure 4:
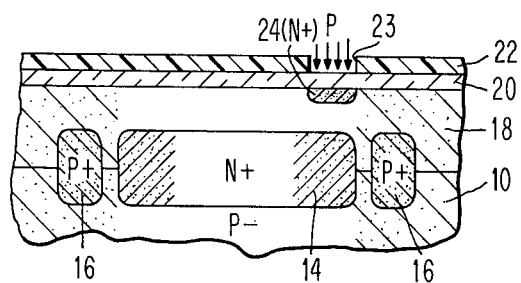
Figure 5:
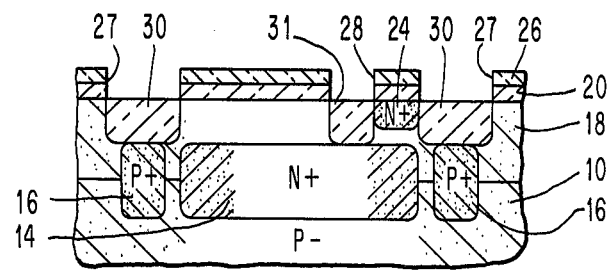

Referring now to the figures of the drawings, and FIG. 1 in particular, a monocrystalline silicon wafer 10 is oxidized forming a masking layer 12. A diffusion window 13 for forming the subcollector is made in the layer 12 using standard photolithographic and subtractive etching techniques. An N-type impurity is then introduced into wafer 10 forming the subcollector region 14. The impurity can be any suitable N-type impurity, as for example arsenic, and can be introduced into the wafer by any suitable technique as for example, capsule diffusion or ion implantation. As shown in FIG. 2 the surface is re-oxidized reforming the masking layer 12 over the subcollector. Diffusion windows 15 are made for the annular subisolation region by standard photolithographic and subtracting etching techniques and a P-type impurity introduced to form the subisolation region 16. The impurity can be of any suitable type, as for example boron introduced by diffusion or ion implantation. As shown in FIG. 3 the masking layer 12 is removed and an epitaxial silicon layer 18 deposited on the surface of wafer 10. During the epitaxial deposition process, which is a high temperature process, the subcollector region 14 and the subisolation region 16 diffuse upwardly into the layer 18. The surface of the epitaxial layer 18 is oxidized in a suitable oxidizing atmosphere, as for example steam at 800° C., forming thermal oxide layer 20. The thickness of layer 20 will be in the range of 500 to 2500 Å, most preferably approximately 800 Å. Layer 20 will remain over the active areas of the device and will constitute part of the finished device. As shown in FIG. 4 a resist layer 22 is deposited over layer 20 and subsequently exposed and developed to form an opening 23 which overlies the position of the collector of the transistor to be fabricated. The resist layer 22 serves as a mask for the ion implantation operation. The wafer is then subjected to a blanket ion implantation of an N-type impurity with sufficient energy to penetrate the oxide layer 20 and enter the material of epitaxial layer 18. Preferably phosphorus is implanted at an energy of 180 to 400 kev with a dosage of 2 to $3 \times 10^{15}$ ions per centimeters$^2$. This results in the formation of a reach through region 24. If desired the reach through region can be deleted if the increased collector resistance is acceptable. Resist layer 22 is removed and, as shown in FIG. 5, a layer 26 of $Si_3N_4$ is deposited over layer 20. Layer 26 will serve as a mask to prevent oxidation of the underlying regions of the epitaxial layer during formation of the recessed oxidation isolation regions which will be described hereafter. In order to form openings in the layer 26 a layer of $SiO_2$, not shown, is deposited over layer 26 by conventional chemical vapor deposition techniques that are well known in the industry and will not be described. A layer of photoresist not shown is then deposited over the layer of CVD $SiO_2$. The resist layer is then exposed, developed and portions removed which overlie the subisolation region 16. A second opening is made which will result in an oxide region which separates the base and emitter region from the collector reach through region. The exposed areas of the underlying CVD $SiO_2$ layer are removed by conventional etching techniques. This layer of CVD $SiO_2$ is then used as a mask to remove the portions of the layer 26 formed of $Si_3N_4$ resulting in openings 27 which overlie the subisolation region 16 and opening 28 which overlies the region which will separate the collector reach through region from the base regions of the transistor device. The exposed areas of layer 20 are removed by conventional etching techniques. Subsequently, a portion of the epitaxial layer 20, that is exposed through windows 27 and 28 is removed by subtractive etching or reactive ion etching to a depth approximately ½ the depth that the recessed oxide regions will extend into the epitaxial layer. The CVD $SiO_2$ layer overlying layer 26 is normally removed during the etching operations to remove the exposed areas of layer 20. The device is then exposed to an oxidizing atmosphere which results in the formation of the recessed oxide regions 30 and the region 31 separating the collector reach through region from the base and emitter. The oxidizing atmosphere is typically steam heated at 1000° C. During this heating operation the collector reach through region 24 expands as shown in FIG. 5 to substantially contact or actually contact the subcollector 14.

Figure 6:
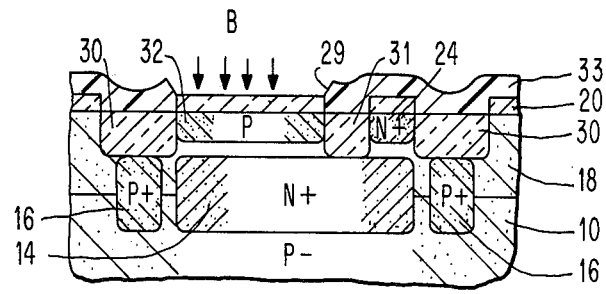
Figure 7:
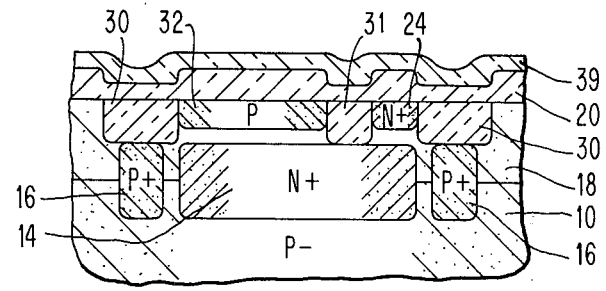

As shown in FIG. 6 the $Si_3N_4$ layer 26 is removed and a layer of photoresist 33 deposited on the surface of the device. The resist layer 33 is exposed, developed to form an opening 29 which overlies the intended base region of the transistor. A suitable P-type impurity is ion implanted through layer 20 into the epitaxial layer 18 to form base region 32. Preferably the base 32 is formed by ion implanting boron with two energy levels. For example, a first implant at 50 kev with a dosage of $1.5 \times 10^{14}$ ions per centimeter$^2$ and a second implant at 150 kev with a dosage of $2.0 \times 10^{13}$ ion per centimeter$^2$. At this point in the process resistors can be formed in different parts of the device by removing the resist layer 33 and depositing another photoresist layer. This resist layer is then exposed and developed to define openings wherein ions can be implanted in the epitaxial layer 18 through oxide layer 20. After the implantation is complete the resist layer is again removed and the thickness of oxide layer 20 can be increased as indicated in FIG. 7. The initial thickness of layer 20 was selected to provide the optimum conditions for implanting ions through the layer to form the various regions of the device. The thickness of layer 20 can be preferably increased by chemical vapor deposition of $SiO_2$ which is well known in the technology. The thickness of layer 20 can be increased to any suitable thickness which will prove advantageous in the finished device. There is also deposited a layer 39 of $Si_3N_4$ also by chemical vapor deposition techniques which are known in the technology. The increasing of the thickness of layer 20, and the deposition of $Si_3N_4$ are optional.

Figure 8:
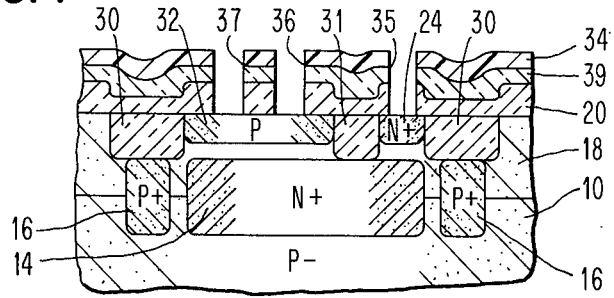
Figure 9:
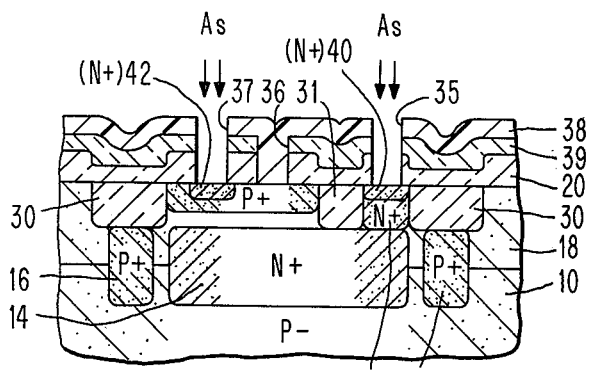
Figure 10:
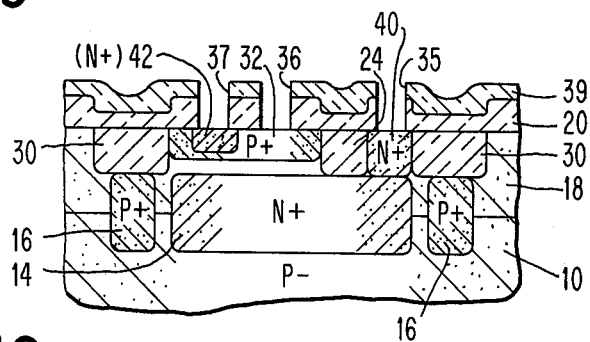

As illustrated in FIG. 8, a resist layer 34 is deposited over layer 39 which is exposed and developed to produce a window 35 for the collector contact, a window 36 for the base contact, and a window 37 for the emitter contact and emitter implantation operation. The underlying exposed areas of layer 39 and oxide layer 20 are removed preferably by reactive ion etching which produces openings with straight sidewalls and no significant undercutting. However if desired the exposed areas of layers 20 and 39 can be removed by conventional chemical etching techniques which are known in the technology. The resist layer 34 is then removed and resist layer 38 deposited over layer 39. As shown in FIG. 9 resist layer 38 is exposed and developed to leave exposed openings 35 and 37 which overlie the collector contact and the region where the emitter will be formed, and block off opening 36, shown in FIG. 8. A suitable N-type impurity is implanted through openings 35 and 37 forming the collector contact 40 and the emitter 42. The impurity is an N-type impurity, as for example arsenic which can be ion implanted at an energy on the order of 40 kev with a dosage preferably in the range of 7.5 to $8 \times 10^{15}$ ions per centimeter$^2$. The resist layer 38 is removed and the device heated to activate the implanted impurities and to drive the emitter 42 and collector region 40 further into the epitaxial layer 18. The annealing operation allows the silicon lattice which has been damaged during the various ion implantation steps to regrow. The drive-in involves heating the device to a temperature in the range of 900° to 1100° C. preferably 1000° C. The time of the anneal depends on the dosage of the various implanted areas. In general the time varies from 50 minutes to 2 hours. As indicated in FIG. 10 the emitter region 42 expands deeper into the device and the collector contact 40 merges with the impurity introduced in the collector reach through region 24. The device illustrated in FIG. 10 is now ready for the deposition and fabricating of the metallurgy system which will interconnect the device shown with other devices, resistors, and the like on the same substrate 10 into electrical circuits. The forming of the metallurgy system is well known in the art and will not be discussed or described. It will be understood that the preferred embodiment illustrated and described in FIGS. 1 through 10 is an NPN device. It is understood that the conductivity types could be reversed, the impurities changed and other modifications made without departing from the spirit of the invention.

Figure 11:
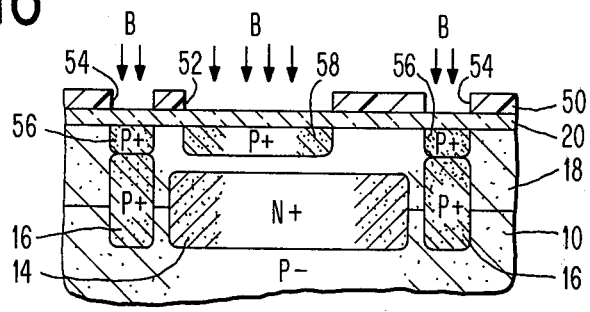
FIGS. 11 and 12 are elevational views in broken section illustrating an alternate embodiment of the method of the invention which compliments the process steps illustrated in FIGS. 1 through 10.
Figure 12:
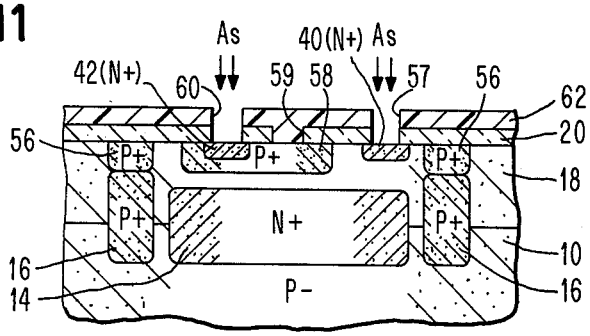

Referring now to FIGS. 11 and 12 there is depicted another preferred specific embodiment of the method of the invention. In this embodiment the annular shaped isolation means, instead of being a recessed oxide, consists of junction isolation. The same process steps described in FIGS. 1 through 3 are used to fabricate a subcollector region 14, annular subisolation region 16 and oxide layer 20. As indicated in FIG. 11 the impurities selected for regions 14 and 16 are such that the region 16 will diffuse upwardly into the epitaxial layer 18 at a faster rate than the impurity in the subcollector 14. A resist layer 50 is deposited over layer 20, which is exposed and developed to define a window 52 overlying the ultimate base region, and a second window 54 overlying subisolation region 16. P-type ions are implanted through windows 52 and 54 forming isolation region 56 and base region 58. These ion implantation steps take place through oxide layer 20 which remains in place on the substrate in the finished device. Resist layer 50 is removed and another resist layer, not shown, deposited and developed to form the collector window 57, the base contact window 59, and the emitter window 60 in oxide layer 20. This resist layer, not shown, is then removed and a block off resist layer 62 deposited on oxide layer 20 as shown in FIG. 12. Resist layer 62 is exposed and developed to leave an opening 57 and 60 open while blocking the base contact window 59. N-type ions are implanted forming the emitter region 42 and the collector contact 40. This implantation is carried out under the same conditions described in the embodiment shown in FIG. 9. Resist layer 62 is then removed and the device annealed in the same manner described with regard to the embodiment shown in FIG. 10. At this stage the metallurgy system can be deposited on the surface of the device over layer 20. The thickness of oxide layer 20 can be increased following the isolation and base implant if desired. Also it is understood that the collector reach through region 24 shown in FIG. 4 could be formed in the device shown in FIG. 11.

While the invention has been shown and particularly described with reference to a preferred embodiment, it will be understood by those skilled in the art that various changes in form and detail may be made therein without departing from the spirit and scope of the invention.

What is claimed is:

1. An improved process for making an integrated circuit semiconductor device in a monocrystalline semiconductor substrate comprising:
   forming a subcollector region of a first conductivity type in a monocrystalline semiconductor substrate of a second opposite conductivity type,
   depositing an epitaxial layer of semiconductor material on said substrate,
   oxidizing the surface of said epitaxial layer to form a layer of thermally grown $SiO_2$ having a thickness in the range of 500 to 2500 Å,
   forming an annular shaped isolation means that at least encompasses the region of said epitaxial layer overlying said subcollector region,
   depositing a first layer of photoresist over the layer of $SiO_2$,
   exposing, developing and removing a portion of said first layer of photoresist to define a window for a base region overlying in part said subcollector,
   ion implanting an impurity of a second conductivity through the window to form a base region,
   removing said first layer of photoresist,
   depositing a second layer of photoresist over the layer of $SiO_2$,
   exposing, developing and removing portions of said second layer of photoresist to define windows for the collector contact, the base contact, and the emitter contact,
   removing the exposed areas of said layer of $SiO_2$ to define the collector contact, the base contact and the emitter contact,
   removing said second layer of photoresist,
   depositing a third layer of photoresist,
   exposing, developing and removing portions of said third layer of photoresist to redefine the collector contact and the emitter contact,
   ion implanting an impurity of a first conductivity to form the collector contact region and the emitter region,
   removing said third layer of photoresist,
   heating the resultant device at a temperature in the range of 900° to 1100° C. to activate the implanted first and second type impurities, and to drive in the ion implanted first impurity in said emitter region,
   deposit the metallurgy system.

2. The process of claim 1 wherein said first conductivity type is N, and said second conductivity type is P.

3. The process of claim 1 wherein the thickness of said layer of thermally grown $SiO_2$ is in the range of 600 to 2000 Å.

4. The process of claim 1 wherein said annular shaped isolation means is formed by,
   depositing a layer of $Si_3N_4$ over the layer of $SiO_2$,
   forming an annular opening through the $Si_3N_4$ and $SiO_2$ layers,
   removing a portion of the epitaxial layer exposed by said annular opening, and
   oxidizing the epitaxial layer exposed by said annular opening thereby forming a recessed oxide region that extends into the epitaxial layer.

5. The process of claim 1 wherein said annular shaped isolation means is formed by implanting an impurity for semiconductors of a second conductivity into said epitaxial layer to form an annular shaped region about the subcollector region thereby forming the sidewall isolation of the epitaxial region overlying the subcollector region.

6. The process of claim 1 wherein following the removal of said first layer of photoresist a layer of $SiO_2$ is deposited over said layer of thermally grown $SiO_2$, the combined thicknesses of the layers being in the range of 1000 to 3000 Å.

7. The process of claim 1 wherein said exposed areas of the $SiO_2$ layer through the windows of said second photoresist layer are removed by reactive ion etching.

8. The process of claim 1 wherein following the forming of a layer of thermal $SiO_2$ on the surface of the epitaxial layer, a layer of photoresist is deposited, the photoresist layer is exposed, developed, and a portion overlying the subcollector region removed to form a window for the collector reach through region, ion implanting an impurity of a first conductivity type through the window to form a collector reach through region.

9. The process of claim 2 wherein the thickness of the epitaxial layer of semiconductor material is in the range of 1 to 4 micrometers.

10. The process of claim 4 wherein an annular subisolation region of a second conductivity type is formed in said substrate which surrounds said subcollector region, said subisolation region together with annular recessed oxide region forming the sidewall isolation of the epitaxial region overlying said subcollector region.

11. The process of claim 5 wherein an annular subisolation region of a second conductivity type is formed in said substrate which surrounds said subcollector region, said subisolation region together with the annular shaped region of second conductivity in the epitaxial layer forming sidewall isolation of the epitaxial region overlying said subcollector region.

* * * * *